(12) United States Patent
Wheelwright et al.

(10) Patent No.: US 9,787,247 B2
(45) Date of Patent: Oct. 10, 2017

(54) SOLAR CONCENTRATOR WITH ASYMMETRIC TRACKING-INTEGRATED OPTICS

(71) Applicant: Sharp Laboratories of America (SLA), Inc., Camas, WA (US)

(72) Inventors: Brian Wheelwright, Tucson, AZ (US); Wei Pan, Vancouver, WA (US); Douglas Tweet, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 34 days.

(21) Appl. No.: 14/577,842

(22) Filed: Dec. 19, 2014

(65) Prior Publication Data

US 2016/0099675 A1    Apr. 7, 2016

Related U.S. Application Data

(63) Continuation-in-part of application No. 14/503,822, filed on Oct. 1, 2014.

(51) Int. Cl.
   *H02S 40/44*    (2014.01)
   *F24J 2/08*    (2006.01)
   (Continued)

(52) U.S. Cl.
   CPC .............. *H02S 40/44* (2014.12); *F24J 2/085* (2013.01); *F24J 2/12* (2013.01); *F24J 2/18* (2013.01);
   (Continued)

(58) Field of Classification Search
   CPC .............. H01L 31/054; H01L 31/0543; H01L 31/0547; H01L 31/0549; H02S 40/20; H02S 40/22; H02S 40/40
   See application file for complete search history.

(56) References Cited

U.S. PATENT DOCUMENTS

| 4,350,837 A | 9/1982 | Clark |
| 4,700,013 A | 10/1987 | Soule |

(Continued)

FOREIGN PATENT DOCUMENTS

WO    WO2011GB1697    12/2011

OTHER PUBLICATIONS

Two-stage concentrator permitting concentration factors up to 300 x with one-axis tracking, Brunotte, M. et al., U. (Jan. 1, 1996). Solar Energy, 56, 3, 285-300.

(Continued)

*Primary Examiner* — Bethany L Martin
(74) *Attorney, Agent, or Firm* — Law Office of Gerald Maliszewski; Gerald Maliszewski

(57) ABSTRACT

A method is provided for using asymmetrically focused photovoltaic conversion in a hybrid parabolic trough solar power system. Light rays received in a plurality of transverse planes are concentrated towards a primary linear focus in an axial plane, orthogonal to the transverse planes. T band wavelengths of light are transmitted to the primary linear focus, while R band wavelengths of light are reflected towards a secondary linear focus in the axial plane. The light received at the primary linear focus is translated into thermal energy. The light received at the secondary linear focus is asymmetrically focused along a plurality of tertiary linear foci, orthogonal to the axial plane. The focused light in each tertiary linear focus is concentrated into a plurality of receiving areas and translated into electrical energy. Asymmetrical optical elements are used having an optical input interfaces elongated along rotatable axes, orthogonal to the axial plane.

8 Claims, 11 Drawing Sheets

(51) Int. Cl.
F24J 2/12 (2006.01)
H01L 31/054 (2014.01)
H02S 40/20 (2014.01)
F24J 2/18 (2006.01)

(52) U.S. Cl.
CPC ...... *H01L 31/0543* (2014.12); *H01L 31/0547* (2014.12); *H02S 40/20* (2014.12); *Y02E 10/42* (2013.01); *Y02E 10/43* (2013.01); *Y02E 10/52* (2013.01); *Y02E 10/60* (2013.01)

(56) References Cited

U.S. PATENT DOCUMENTS

| | | | |
|---|---|---|---|
| 4,964,713 A * | 10/1990 | Goetzberger | F24J 2/06 136/246 |
| 5,505,789 A | 4/1996 | Fraas et al. | |
| 7,569,764 B2 | 8/2009 | Shan et al. | |
| 8,410,351 B1 | 4/2013 | Gu | |
| 8,455,755 B2 | 6/2013 | Correia et al. | |
| 8,546,686 B2 | 10/2013 | Ashkin | |
| 2006/0072222 A1* | 4/2006 | Lichy | F24J 2/06 359/853 |
| 2007/0137690 A1* | 6/2007 | Bruning | F24J 2/06 136/246 |
| 2009/0250095 A1* | 10/2009 | Thorley | F24J 2/085 136/246 |
| 2011/0023866 A1 | 2/2011 | Divinadio et al. | |
| 2012/0279554 A1 | 11/2012 | Bostwick | |
| 2013/0220307 A1 | 8/2013 | Stettenheim | |
| 2013/0220312 A1 | 8/2013 | Stettenheim et al. | |
| 2013/0233750 A1 | 9/2013 | Ikuta | |
| 2013/0255753 A1 | 10/2013 | Escher et al. | |
| 2013/0306139 A1 | 11/2013 | Bostwick | |
| 2013/0314774 A1 | 11/2013 | Page et al. | |
| 2014/0026945 A1 | 1/2014 | Correia et al. | |
| 2014/0041708 A1 | 2/2014 | Wang et al. | |
| 2014/0166077 A1* | 6/2014 | Gupta | F24J 2/12 136/246 |
| 2015/0372640 A1* | 12/2015 | Yang | H02S 40/22 136/248 |

OTHER PUBLICATIONS

"BICON: high-concentration PV using one-axis tracking and silicon concentrator cells", Mohr, A et al, (Jan. 1, 2006). Progress in Photovoltaics, 14, 7, 663-674.
"Theory and design of line-to-point focus solar concentrators with tracking secondary optics", T. Cooper et al., Appl. Opt. vol. 52, 8586-8616 (2013).
"Spectral beam splitting technology for increased . . . ", A.G. Imenes et al., Solar Energy Materials & Solar Cells. vol. 84, pp. 19-69 (2004).
Thin-film multilayer filter designs for hybrid solar energy conversion systems, L. DeSandre et al., Proceedings of the SPIE vol. 562, pp. 155-159 (1986).
"Spectral selectivity applied to hybrid concentration systems", M.A. Hamdy et al., Proceedings of the SPIE vol. 562, pp. 147-154 (1986).
"Efficient hybrid photovoltaic-photothermal solar conversion system with cogeneration", D.E. Soule, E.F. Rechel, D.W. Smith, and F.A. Willis, SPIE vol. 562, pp. 166-173 (1985).
"Heat-Mirror Spectral Profile Optimization for TSC Hybrid Solar Conversion", D.E. Soule and S.E. Wood, SPIE vol. 653, p. 172-180 (1986).
Bandwidth and angle selective holographic films for solar energy applications, C.G. Stojanoff, J. Schulat, and M. Eich, SPIE vol. 3789, pp. 38-49 (1999).
"Optical modeling for a two-stage parabolic trough concentrating . . . ", S. Jian et al., Solar Energy Materials and Solar Cells vol. 94 1686-1696 (2010).
Thomas Cooper et al., "Theory and design of line-to-point focus solar concentrators with tracking secondary optics," Appl. Opt. 52, 8586-8616 (2013).

* cited by examiner

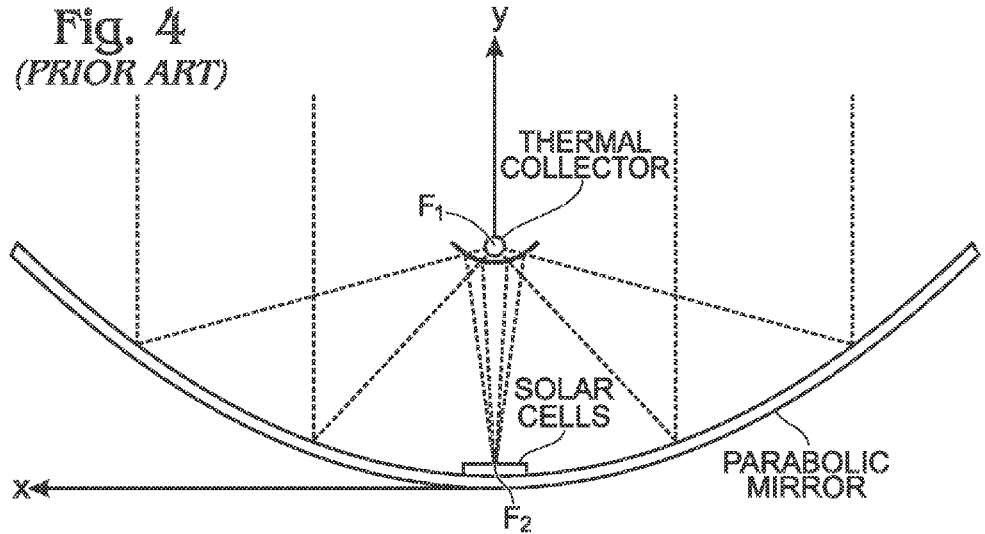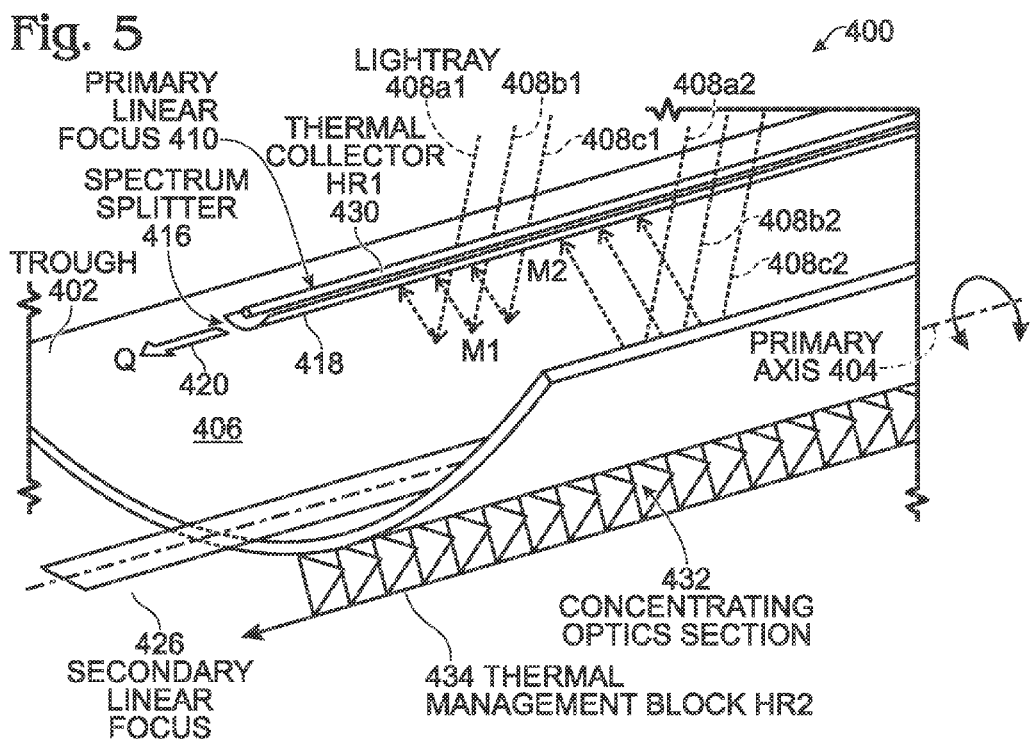

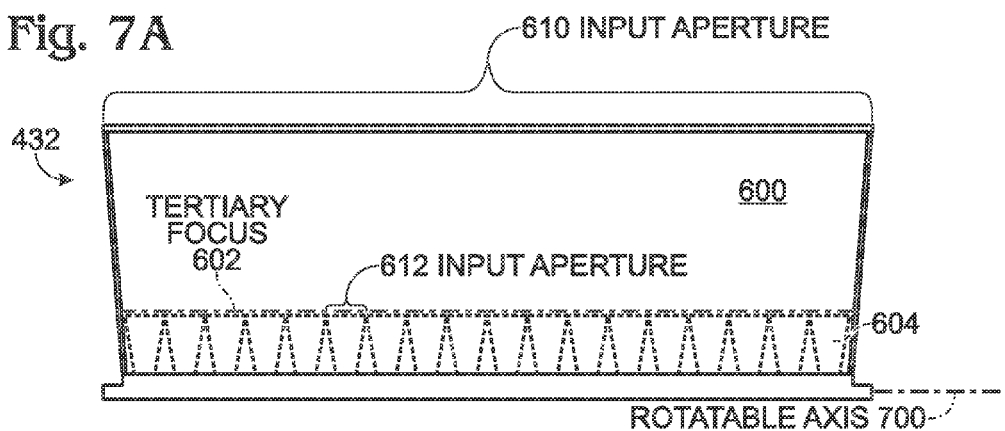
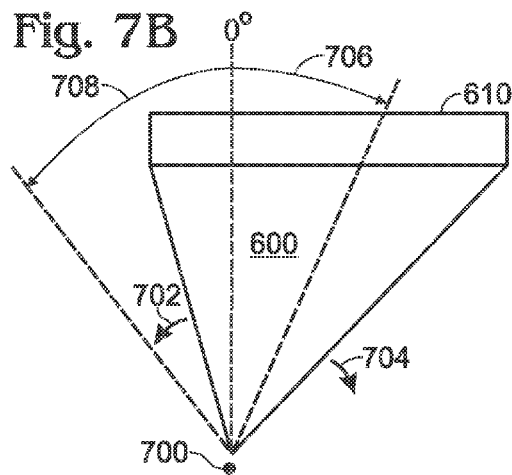
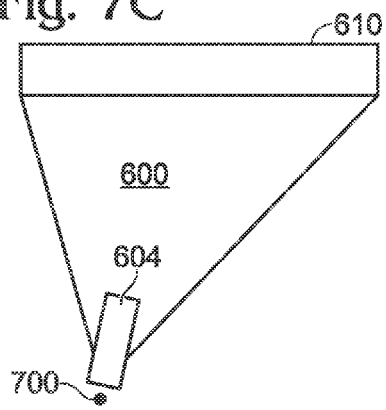
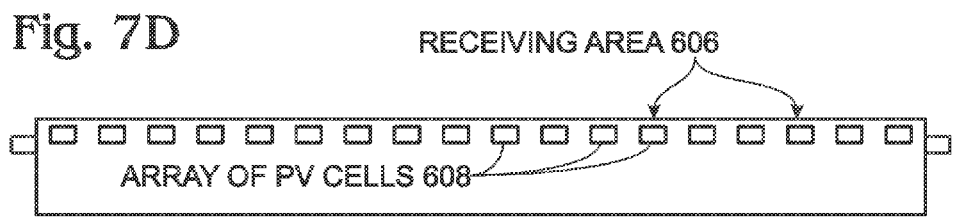

Fig. 9 SYMMETRIC LINEAR FRESNEL LENS
Fig. 10A SUNLIGHT
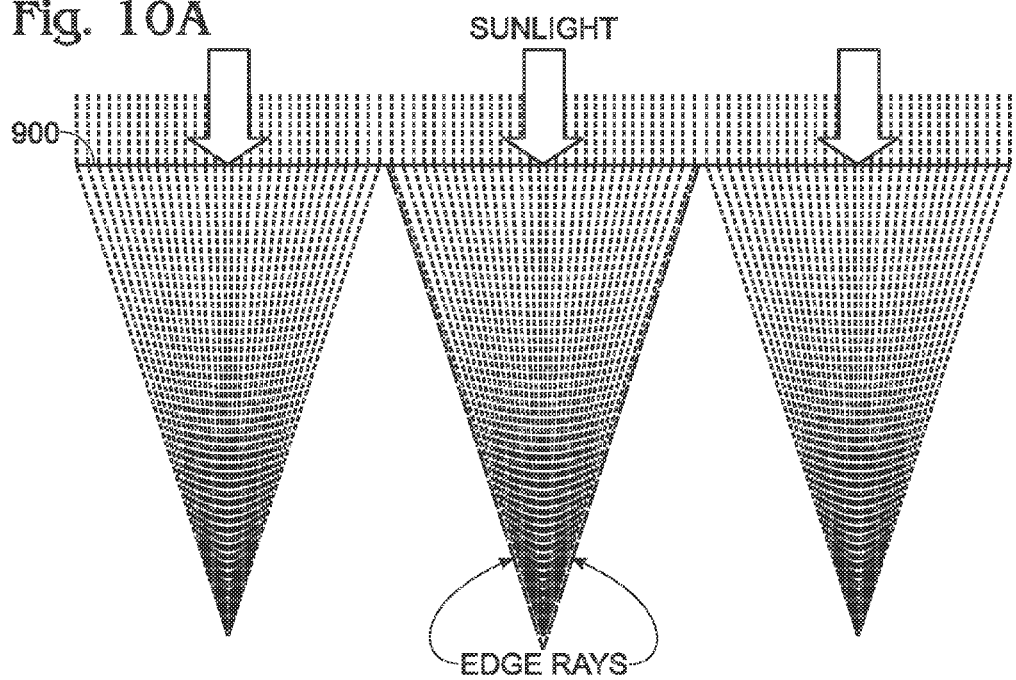
EDGE RAYS
Fig. 10B
SYMMETRIC INTERFERENCE-FREE ROTATION
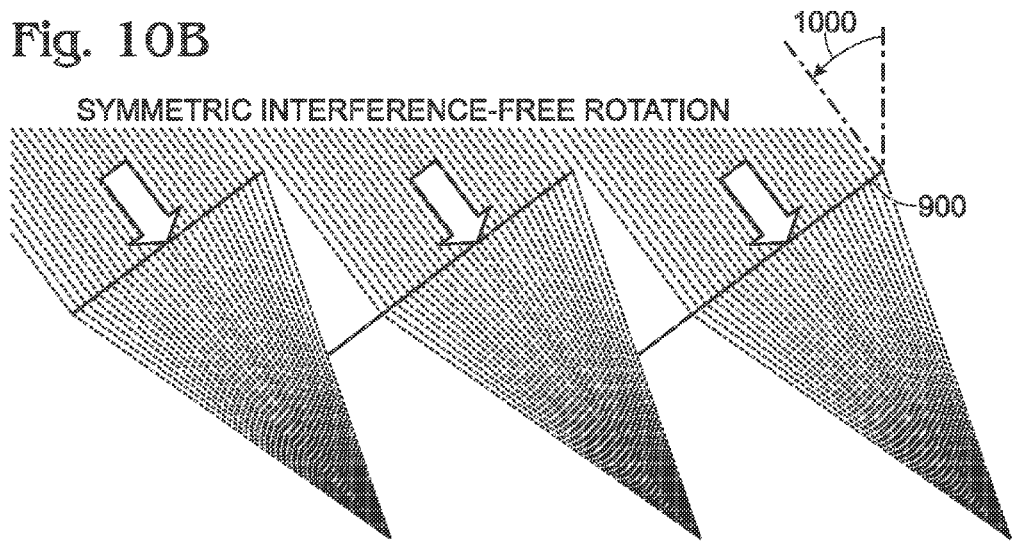

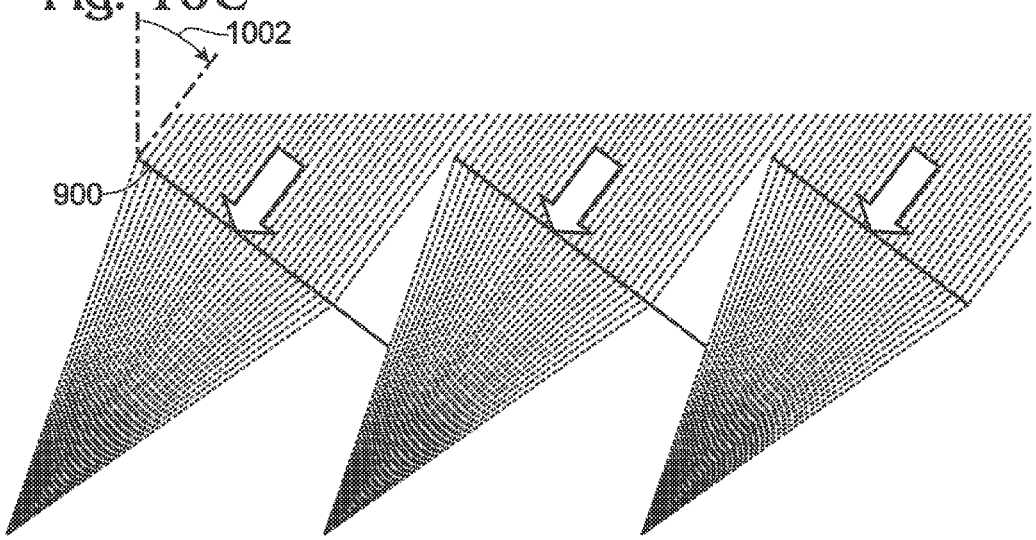
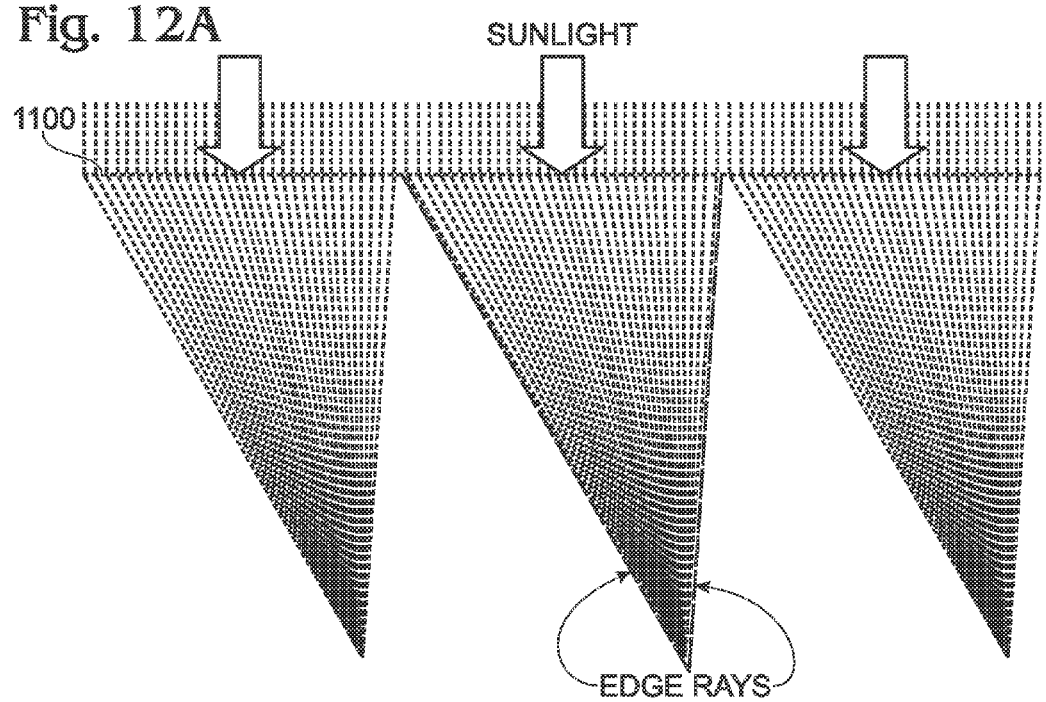

ASYMMETRIC INTERFERENCE-FREE ROTATION

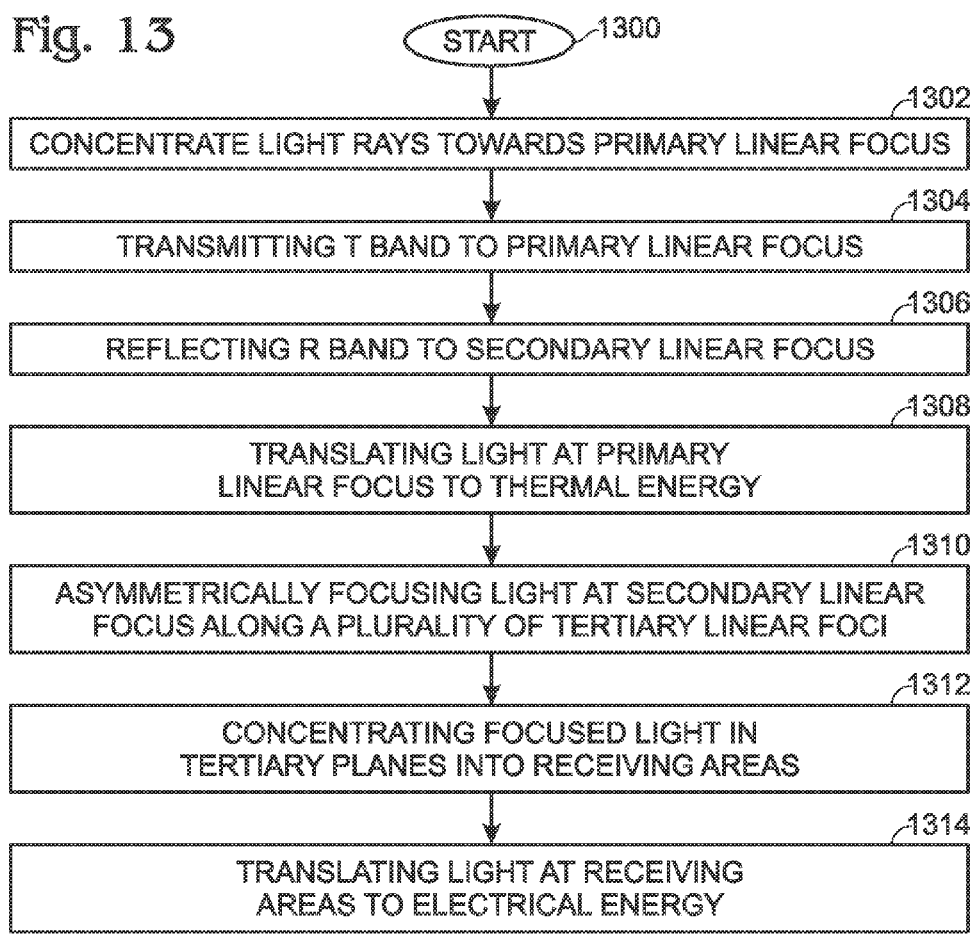

SOLAR CONCENTRATOR WITH ASYMMETRIC TRACKING-INTEGRATED OPTICS

RELATED APPLICATIONS

The application is a Continuation-in-part of an application entitled, HYBRID TROUGH SOLAR POWER SYSTEM USING PHOTOVOLTAIC TWO-STAGE LIGHT CONCENTRATION, invented by Wheelwright et al., Ser. No. 14/503,822, filed Oct. 1, 2014, which is incorporated, herein by reference.

This invention was made with Government support under DE-AR0000465 awarded by DOE. The Government has certain rights in this invention.

BACKGROUND OF THE INVENTION

1. Field of the Invention

This invention generally relates to solar generated power and, more particularly, to a hybrid system that combines thermal and asymmetrical photovoltaic concentration for energy generation and thermal storage.

2. Description of the Related Art

There are two basic approaches to the harvesting of solar energy using concentrating optics. These approaches are: concentrating solar power (CSP), which uses a thermal collector and thermal engine, and concentrating photovoltaics (CPV), which concentrates sunlight onto high-efficiency multi-junction PV cells for direct electrical generation. CSP can be configured to include thermal storage, making its output dispatchable, while CPV is known for its very high efficiency. Therefore, the optimal approach is a system that combines CSP with additional tracking CPV optics.

FIG. 1 is a solar energy collection device using a parabolic trough (prior art). The design of Brunotte et al. [1] is one of the earliest to attempt to convert a line focus into a series of higher concentration foci. In this design, a parabolic trough is used to illuminate a series of solid compound parabolic concentration (CPC) secondaries, each conjugate to a single photovoltaic (PV) cell. The trough is tracked about a polar-aligned axis, so the range of skew angles of sunlight is limited to +/−23.5° throughout the year. The CPCs have square or rectangular apertures, and may have an asymmetric acceptance angle. The acceptance angle in the transverse plane of the trough is determined by the maximum rim angle of the trough. If an asymmetric trough is used, as shown, then the CPCs can be tilted to a median angle, and the acceptance angle is only half the rim angle of the trough. In the other dimension (along the axial plane of the trough), the CPCs are required to have an acceptance angle of +/−23.5°, to maintain seasonal performance.

FIGS. 2A and 2B depict a design of tracking secondaries for conventional troughs, off-axis troughs, and Cassegrain troughs (prior art). Cooper et al. [3] and Thesan S.p.a. [4] both employ a second degree of tracking freedom. In addition to single-axis trough tracking, the secondary optics are allowed to rotate or translate to compensate for the changing incidence angle (within the axial plane of the trough). The secondaries include hollow, rotating CPCs and solid dielectric reflectors. A design with an array of hollow CPCs operates near the prime focus. Alternatively, a laterally-translated cylinder or spherical lenses may be used [4].

FIG. 3 is a partial cross-sectional view depicting reflected and transmitted wavelength bands of a M2 spectrum splitter (prior art). In principle, such a design permits ultraviolet (UV) and infrared (IR) light to be collected as thermal energy at heat receiver 1 (HR1), and visible (Vis) and near infrared (NIR) to be collected as photovoltaic energy. A Cassegrain geometry poses a new obstacle to achieve high concentration. Since Cassegrain optics have a large focal length, the solar image formed below M2 is likewise larger. The primary concentration from a Cassegrain trough is thus lower than it would be at the prime focus. In order to keep the solar image small after the Cassegrain M2, the M2 size should be very large. However, this causes M2 to cast a large shadow on M1 (the trough). Alternatively, M2 can be made very small so that there is minimum shadowing effect. However, the size of the solar image at the base of the trough becomes very large. An alternative approach would require raising the receiver (photovoltaic cells) to be closer to M2. This allows some reduction in the focal length. However, this may affect trough stability due to a raised center of gravity. Therefore, without additional concentration, this design is impractical for both concentrated photovoltaic (CPV) and concentrated solar power (CSP) purposes.

U.S. Pat. No. 5,505,789 uses a tessellating line focus with solid secondary funnels to address the above-mentioned problems associated with Cassegrain optics [5]. U.S. Pat. No. 5,505,789 discloses line-focus lenses and a line-focused PV module. The whole system is an array of linear arched Fresnel lenses with a linear PV cell receiver located along the focal line of each lens. The photovoltaic cell receiver consists of high efficiency cells interconnected in a string with a solid secondary optical element adhesive bonded to the cells. The entrance aperture of each secondary optical element is rectangular in shape and the optical secondaries are butted up against each other in a line to form a continuous entrance aperture along the focal line. In addition to providing more concentrated sunlight, the solid optical secondaries shield the cells from air, moisture, and contaminants, and to a lesser extent against radiation damage. However, since this system does not employ Cassegrain optics or an additional means of concentrating light to the PV cells, it is a low concentrated CPV system. It is not obvious that this system can be modified to use Cassegrain optics, or that the light collected in such a system can be concentrated sufficiently for PV collection, in light of all the reasons mentioned above.

Other beam splitting approaches for solar power include Imenes et al. [6], dichroic filter designs for hybrid solar energy by DeSandre et al. [7], analysis of hybrid solar energy efficiencies by Hamdy et al. [8], and designs of hybrid solar systems by Soule et al. [9, 10].

FIG. 4 is a partial cross-sectional view of a Cassegrain hybrid trough system with PV at the bottom of the trough [11] (prior art). A similar Cassegrain trough system with beam splitter, but with no concentration at PV cells in a slit at vertex of trough is described by Jian et al. [12].

FIGS. 14A through 14C depict symmetric optics geometrically represented with isosceles triangles (prior art). Conventional symmetric optics must have a symmetric interference-free angular range of operation to maximize the capture of solar energy. Each optics section is able to converge edge rays, depicted in phantom in FIG. 14A, to a center point where they can be harvested. When incident light strikes the optical apertures at an angle of 0 degrees, as shown in FIG. 14A, there is no interference. However, when the optical elements are rotated about their individual axes, the element apertures eventually begin clipping the edge rays of the adjacent elements. The interference-free rotation limits are shown in each direction in FIGS. 14B and 14C. The limits are symmetrical about 0° incidence. Thus, when secondary tracking is achieved by individual rotation about (different) secondary tracking axes, interference between adjacent optical elements should be minimized. The interference envelope of each optical element is a function of the edge ray paths, dimension of the aperture, and angular range of motion.

It would be advantageous if a hybrid solar system using Cassegrain optics could be designed with optical elements tailored so that the capture of edge rays is asymmetric, resulting in an angular range which is also asymmetric, and with a range of motion able to match the range of solar incidence at any latitude.

[1] "Two-stage concentrator permitting concentration factors up to 300× with one-axis tracking", Brunotte, M., Goetzberger, A., & Blieske, U. (Jan. 1, 1996). *Solar Energy*, 56, 3, 285-300.

[2] "BICON: high concentration PV using one-axis tracking and silicon concentrator cells", Mohr, A., Roth, T., & Glunz, S. W. (Jan. 1, 2006). *Progress in Photovoltaics*, 14, 7, 663-674.

[3] "Theory and design of line-to-point focus solar concentrators with tracking secondary optics", T. Cooper. G. Ambrosetti, A. Pedretti, and A. Steinfeld, Appl. Opt. vol. 52, 8586-8616 (2013).

[4] "Solar Receiver for a Solar Concentrator with a Linear Focus", A. Balbo Divinadio and M. Palazzetti, Thesan S.p.a., US 2011/0023866, Published Feb. 3, 2011.

[5] "Line-focus photovoltaic module using solid optical secondaries for improved radiation resistance", L. M. Fraas and M. J. Oneill, Entech Inc., U.S. Pat. No. 5,505,789, Granted Apr. 9, 1996.

[6] "Spectral beam splitting technology for increased conversion efficiency in solar concentrating systems: a review", A. G. Imenes and D. R. Mills. Solar Energy Materials & Solar Cells. Vol. 84, pp 19-69 (2004).

[7] "Thin-film multilayer filter designs for hybrid solar energy conversion systems", L. DeSandre, D. Y. Song, H. A. Macleod, M. R. Jacobson, and D. E. Osborn, Proceedings of the SPIE Vol. 562, pp 155-159 (1986).

[8] "Spectral selectivity applied to hybrid concentration systems", M. A. Hamdy, F. Luttmann, D. E. Osborn, M. R. Jacobson, and H. A. Macleod, Proceedings of the SPIE Vol. 562, pp 147-154 (1986).

[9] "Efficient hybrid photovoltaic-photothermal solar conversion system with cogeneration", D. E. Soule, E. F. Rechel, D. W. Smith, and F. A. Willis, SPIE Vol. 562, pp 166-173 (1985).

[10] "Heat-Mirror Spectral Profile Optimization for TSC Hybrid Solar Conversion", D. E. Soule and S. E. Wood, SPIE Vol. 653, p 172-180 (1986).

[11] "Bandwidth and angle selective holographic films for solar energy applications", C. G. Stojanoff, J. Schulat, and M. Eich, SPIE Vol. 3789, pp 38-49 (1999).

[12] "Optical modeling for a two-stage parabolic trough concentrating photovoltaic/thermal system using spectral beam splitting technology", S. Jian, P. Hu, S. Mo, and Z. Chehn, Solar Energy Materials and Solar Cells vol. 94 1686-1696 (2010).

[13] Thomas Cooper, Gianluca Ambrosetti, Andrea Pedretti, and Aldo Steinfeld, "Theory and design of line-to-point focus solar concentrators with tracking secondary optics," Appl. Opt. 52, 8586-8616 (2013).

SUMMARY OF THE INVENTION

A parabolic trough in a solar thermal plant typically tracks the sun about a single North-South oriented axis, allowing East-to-West solar tracking. The trough concentrates solar radiation onto tubular thermal receivers, which convey heated fluid to a thermal engine for electrical generation. In a hybrid concentrating solar power (CSP) and concentrating photovoltiacs (CPV) parabolic system, solar irradiance is split into two wavelength bands by a dichroic mirror placed in between the primary trough mirror and the thermal collecting pipe. The transmitted band focuses onto the thermal collecting pipe like a conventional CSP system, while the reflected band is directed to a secondary linear focus near the vertex of the trough, where an array of CPV optics increase the concentration onto high-efficiency PV cells. The reflected wavelength band is selected for optimal CPV conversion efficiency to generate electricity directly. The thermal energy collected by thermal pipe, on the other hand, can be stored as heat for later use. Thus, this hybrid system not only utilizes solar energy effectively but also provides dispatchable energy through low cost thermal storage. Such a system is described in parent application Ser. No. 14/503,822, which is incorporated herein by reference.

When secondary tracking is achieved by individual rotation about (different) secondary tracking axes, interference between adjacent optical elements can be an issue. The interference envelope of each optical element is a function of the edge ray paths, dimension of the aperture, and angular range of motion. Optical elements operating at a faster (shorter) focal ratio are able to operate over a larger angular range without interference—this is how the problem is currently solved for refractive optics. Disclosed herein is a system that tailors the optical elements such that the edge rays are asymmetric, resulting in an angular range which is also asymmetric. Thus, for the most common form of secondary axis tracking, orthogonal to the trough's primary axis tracking, tailoring of the secondary range of motion permits a match to the range of solar incidence at any latitude.

The CPV array placed near the vertex of the trough moves with the trough throughout its East-West tracking motion. The CPV assemblies are also independently rotated, so that each aperture remains substantially perpendicular to the reflected light from the dichroic mirror. This secondary rotation is about an axis which is perpendicular to the trough tracking axis. This effective dual-axis tracking allows for a much higher concentration of sunlight, as compared to single-axis tracking only.

The range of secondary tracking motion in the hybrid trough is determined by the solar incidence angle on the trough, which changes throughout the day and year. The range of solar incidence angles on the CPV assemblies is highly asymmetric, depending on latitude. At 32.2° N latitude, the range of incidence is −28.1 degrees (to the North) to +55.7 degrees (to the South). The Northern limit is reached on the sunrise/sunset on the summer solstice, while the southern limit is reached at solar noon on the winter solstice. When the individual CPV assemblies are rotated over this range, there is the possibility of mechanical or optical interference between adjacent elements. Conventional symmetric optics have a symmetric interference envelope, resulting in a symmetric angular operational range without interference. The edge rays of conventional lenses are symmetric, forming an isosceles triangle in a plane coincident with the optical axis.

The arrayed optical elements disclosed herein are asymmetric about the optical axis. Since the range of incidence angles is asymmetric, it is preferable to have optical elements whose interference-free angular range is also asymmetric. This results in a de-centered focal point and edge rays which do not form an isosceles triangle. This shift can be tailored to give a prescribed asymmetric angular range (interference-free).

Accordingly, a method is provided for using asymmetrically focused CPV conversion in a hybrid trough solar power system. The method concentrates light rays received in a plurality of transverse planes towards a primary linear focus in an axial plane, orthogonal to the transverse planes. T band wavelengths of light are transmitted to the primary linear focus, while R band wavelengths of light are reflected towards a secondary linear focus in the axial plane, parallel to the primary linear focus. The light received at the primary linear focus is translated into thermal energy. The light received at the secondary linear focus is asymmetrically focused along a plurality of tertiary linear foci, orthogonal to the axial plane. The focused light in each tertiary linear focus is concentrated into a plurality of receiving area and translated into electrical energy.

In one aspect, the step of asymmetrically focusing the light received at the secondary linear focus along the plurality of tertiary linear foci includes the use of a plurality of asymmetrical optical elements having optical input interfaces elongated along rotatable axes, orthogonal to the axial plane, which asymmetrically focus the light. For example, the asymmetrical optical elements may be asymmetrical linear Fresnel lenses. Further, the optical input interfaces can be rotated over an asymmetrical range of rotation, such that the optical input interfaces accept R band reflected light, free of interference from adjacent asymmetrical optical elements, over the asymmetrical range of rotation. For example, the asymmetrical range of rotation may be responsive to the Earth latitudinal position of the system in which the method is performed.

Additional details of the above-described method and a hybrid trough solar power system with asymmetric photovoltaics are presented below.

BRIEF DESCRIPTION OF THE DRAWINGS

FIG. 4 is a partial cross-sectional view of a Cassegrain hybrid trough system with PV at the bottom of the trough [11] (prior art).

FIG. 5 is a perspective view of a hybrid trough solar power system using asymmetrically focused photovoltaic (CPV) conversion in conjunction with a thermal collector.

FIGS. 7A through 7D are views of an exemplary concentrating optics section.

FIG. 9 is a partial cross-sectional view of a symmetric linear Fresnel lens.

FIGS. 10A through 10C depict the interference-free range in an array of adjacent symmetric linear Fresnel lenses.

FIG. 11 is a partial cross-sectional view of an asymmetric linear Fresnel lens.

FIGS. 12A through 12C depict the interference-free range in an array of adjacent asymmetric linear Fresnel lenses.

FIG. 13 is a flowchart illustrating a method for using asymmetrically focused CPV conversion in a hybrid trough solar power system.

DETAILED DESCRIPTION

Figure 1:
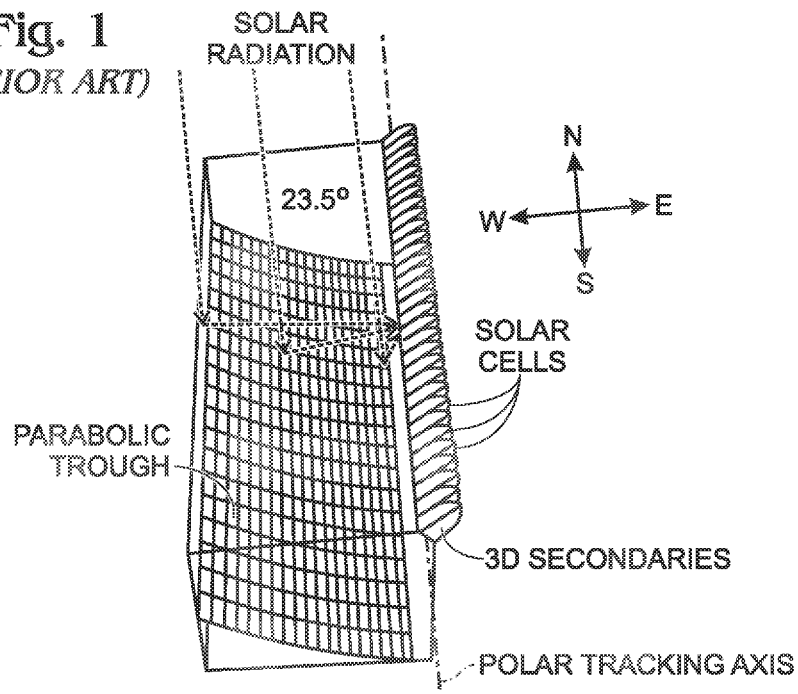
FIG. 1 is a solar energy collection device using a parabolic trough (prior art).
Figure 2A:
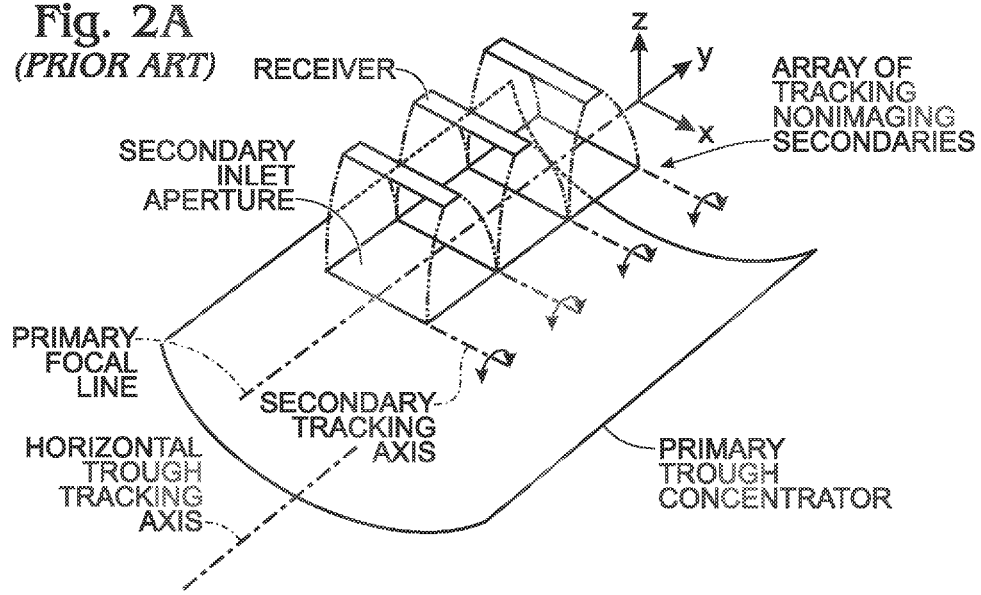
FIGS. 2A and 2B depict a design of tracking secondaries for conventional troughs, off-axis troughs, and Cassegrain troughs (prior art).
Figure 2B:
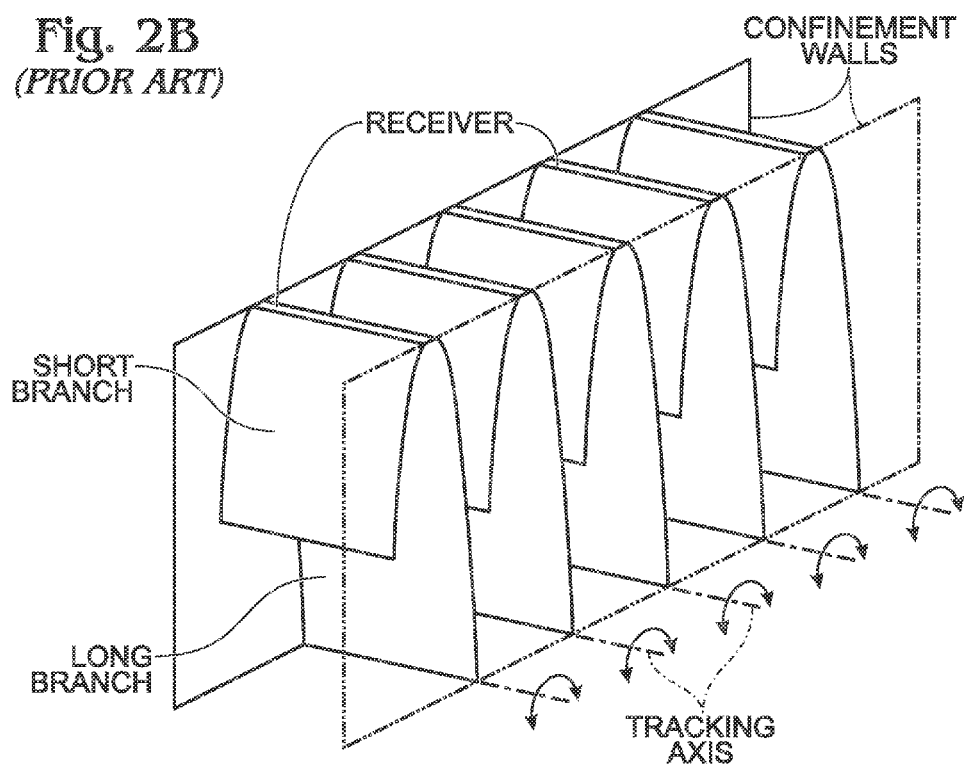
Figure 3:
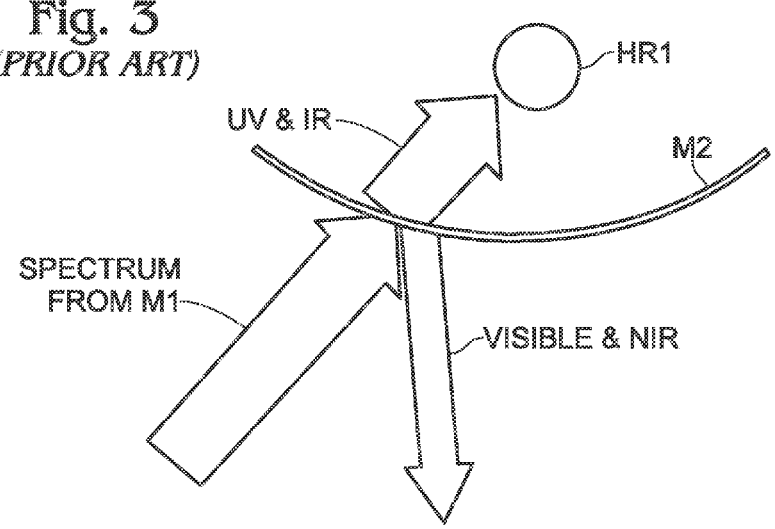
FIG. 3 is a partial cross-sectional view depicting reflected and transmitted wavelength bands of a M2 spectrum splitter (prior art).

FIG. 5 is a perspective view of a hybrid trough solar power system using asymmetrically focused photovoltaic (CPV) conversion in conjunction with a thermal collector. The system 400 comprises a reflective trough 402 having a primary axis 404 and a parabolic curved surface 406 for concentrating light rays (e.g., light rays 408a1 through 408c2) received in a plurality of transverse planes into a primary linear focus 410 in an axial plane (not shown), orthogonal to the transverse planes. For example, light rays 408a1 and 408a2 are in one transverse plane and light rays 408c1 and 408c2 are in another transverse plane. In one aspect, the reflective trough 402 is rotatable about the primary axis 404.

A dichroic spectrum splitter 416 has a hyperbolically curved surface 418, an axis 420 aligned in parallel to the primary linear focus 410, and a position between the reflective trough 402 and the primary linear focus 410. In one aspect, the T band wavelengths of light include both wavelengths greater than near infrared (NIR) and less than FIR, and the R band wavelengths include NIR wavelengths of light. However, the T and R bands are not necessarily limited to these exemplary ranges of wavelength.

Figure 6A:
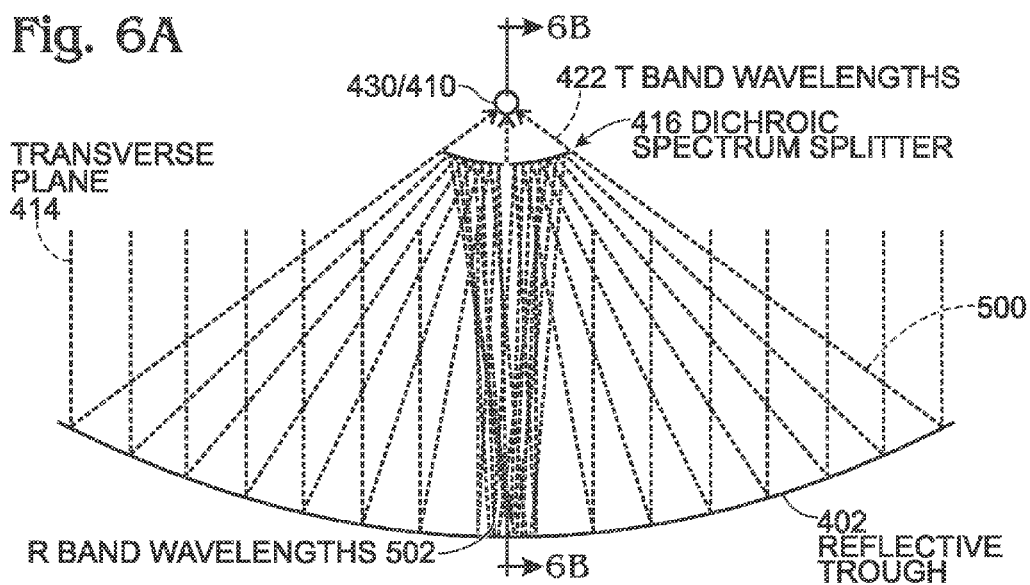
FIGS. 6A and 6B are partial cross-sectional views of the dichroic spectrum splitter.
Figure 6B:
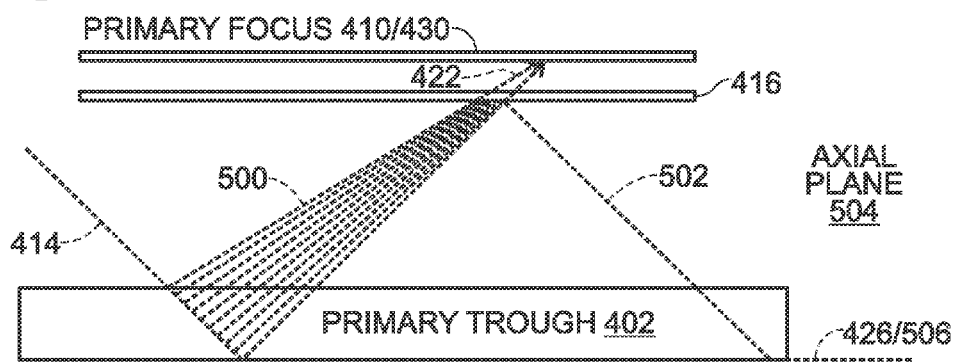

FIGS. 6A and 6B are partial cross-sectional views of the dichroic spectrum splitter 416. Light rays accepted by the reflective trough 402 in transverse plane 414 are reflected to the dichroic spectrum splitter, as represented by rays 500. The dichroic spectrum splitter 416 transmits T band wavelengths of light 422, and reflects R band wavelengths light 502 to a secondary linear focus 426 formed parallel to a vertex 506 of the reflective trough 402 in the axial plane 504. In this example, the secondary linear focus 426 and the vertex 506 are collocated, and the axial plane 504 is the plane facing the reader in FIG. 6B (i.e. the sheet upon which FIG. 6B is formed). A thermal collection tube 430 (HR1) is aligned along the primary linear focus 410 for the light transmitted by the dichroic spectrum splitter 416. For simplicity, the thermal collection tube 430 is shown aligned along the primary linear focus 410.

Returning to FIG. 5, a plurality of concentrating optics sections 432 are formed in series along the secondary linear focus 426. Ideally, the secondary linear focus would be a narrowly focused line in the axial plane. However, due to the longer focal length of the Cassegrain optical path, the secondary linear focus 426 is of lower concentration than the primary linear focus 410. The secondary linear focus is represented here as a narrow plane transverse to the axial plane. As explained below, concentrating optics sections are used to boost the concentration of the second linear focus 426.

FIGS. 7A through 7D are views of an exemplary concentrating optics section 432. Each concentrating optics section 432, also referred to herein as concentrating lens (CL) optics, comprises an asymmetrical optical element 600 for focusing the R band wavelengths of light reflected by the dichroic spectrum splitter along a tertiary linear focus 602, orthogonal to the axial plane. For example, the asymmetrical optical element 600 may be an asymmetrical linear Fresnel lens, as described in more detail below. Optionally, as shown in phantom in FIG. 7A, a plurality of optical funnels 604, with input interfaces 612, may be used to concentrate the R band wavelengths of light focused by the asymmetrical optical element 600 to a corresponding plurality of receiving areas 606 (i.e. the optical interface of a corresponding PV device). In FIG. 7C, one optical funnel 604 is shown in cross-section.

A plurality of PV devices 608 each have an optical interface formed at a corresponding receiving area 606. In one aspect, the PV devices 608 are multi-junction cells, each junction having an energy bandgap converting R band wavelengths of light to electrical current. For example, if the dichroic spectrum splitter reflects light in the R band of wavelengths between 500 and 810 nanometers (nm), then the PV devices 608 may be double junction tandem cells with energy bandgaps of 1.88 electron volts (eV) and 1.43 eV, or triple junction tandem cells with an energy bandgaps of 2.05 eV, 1.77 eV, and 1.43 eV. Alternatively, if the dichroic spectrum splitter reflects light in the R band of wavelengths between 650 and 850 nm, the PV devices 608 may be single junction cells with an energy bandgap of 1.43 eV. In another aspect, if the dichroic spectrum splitter reflects light in the R band of wavelengths between 700 and 1000 nm, then the PV devices 608 may be single junction cells with an energy bandgap of 1.1 eV.

Each asymmetrical optical element 600 has an optical input aperture 610, also referred to herein as an optical input interface, elongated along a rotatable axis 700, orthogonal to the axial plane and typically orthogonal to the secondary linear focus. Likewise, each optical funnel 604 in the concentrating optics section 432 has an optical input aperture 612 underlying the asymmetrical optical element 600 and elongated orthogonal to the axial plane.

In one aspect, the asymmetrical optical elements 600 are asymmetrically rotatable. As shown in FIG. 7B, the asymmetrical optical element 600 may rotate further in one direction, as indicated by reference 702, than it does in the other direction, as indicated with reference designator 704. For example, each asymmetrical optical element 600 may have a rotatable maximum first angle 706 in a first direction during the sunrise or sunset of a summer solstice, and rotatable maximum second angle 708, greater than the first angle, in a second direction opposite the first direction, at a winter solstice noon. In that case, the first angle 706 and second angle 708 would be responsive to an Earth latitudinal position of the system in order to obtain maximum efficiency. Alternatively stated, the first angle 706 would increase and the second angle 708 would decrease in response to moving the position of the system closer to the Earth's equator. As a result, each asymmetrical optical element 600 accepts light, free of interference from adjacent asymmetrical optical elements, in a duration of time between a summer solstice and a winter solstice, as shown in more detail in FIGS. 8B and 8C. Also as shown in FIG. 8A, each asymmetrical optical element has an off-center focal point, accepting edge rays that do not form an isosceles triangle as they converge on the focal point.

Figure 8A:
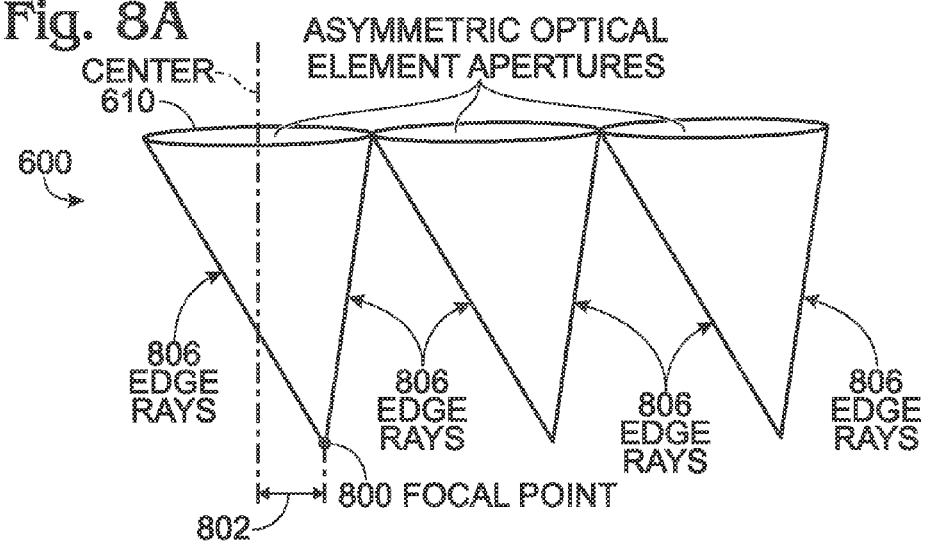
FIGS. 8A through 8C depict asymmetric optical elements having an asymmetric interference-free angular range.
Figure 8B:
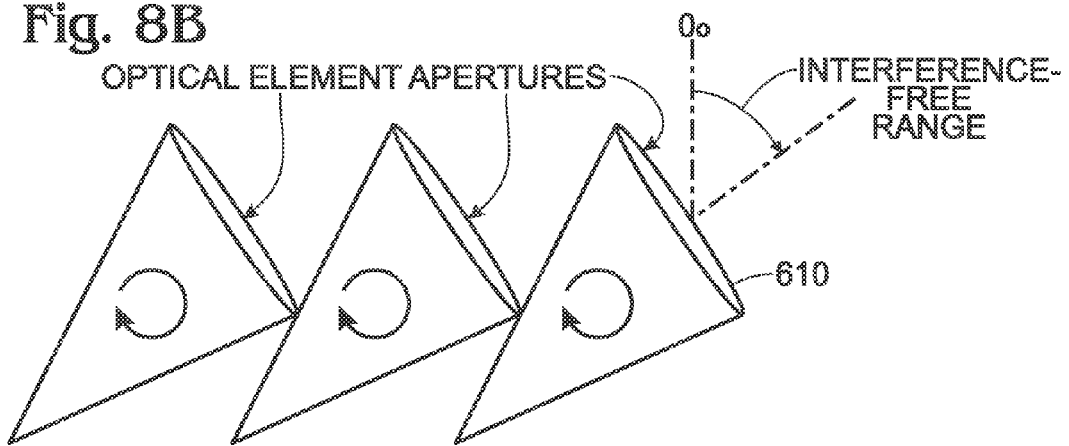
Figure 8C:
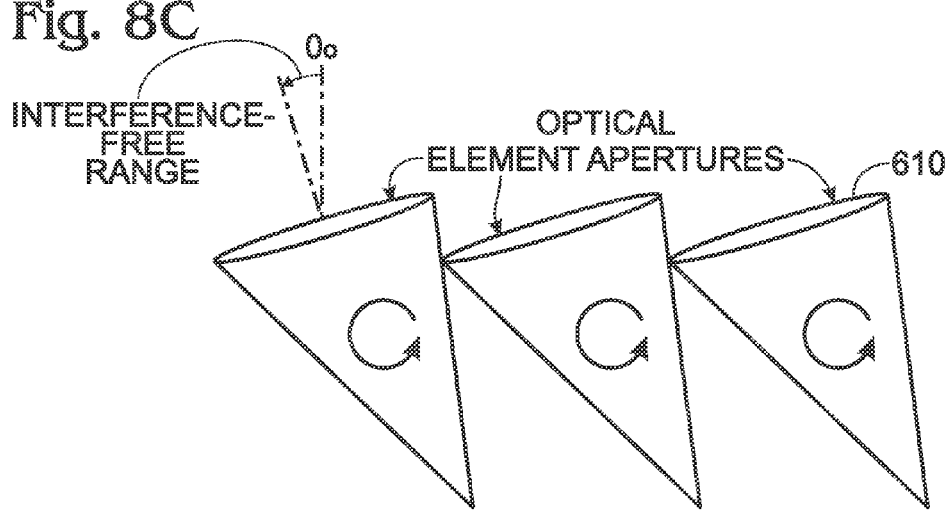

FIGS. 8A through 8C depict asymmetric optical elements having an asymmetric interference-free angular range. The asymmetric optical elements 600 are geometrically represented with non-isosceles triangles. Although the asymmetric optical elements in FIGS. 7B and 7C are shown as having "sides" that form a triangle in conjunction with the optical input interface and focal point, it should be understood that these sides may be only for the purpose of mechanically supporting the optical input interface. As shown in FIGS. 8A-8C, the asymmetric optical element 600 may be comprised solely of the optical input interface (e.g., an asymmetric linear Fresnel lens), and the "sides" merely represent the boundaries of converging edge rays from an array of positive-powered asymmetrical optics. Also shown in FIG. 8A, the focal point 800 of the asymmetric optical element is off-center of the asymmetric optical element, as represented by reference designator 802. Thus, an array of three generalized asymmetric optical elements is shown with their corresponding edge rays 806, forming non-isosceles triangles. The interference-free rotation limits are shown in each direction in FIGS. 8B and 8C. The limits are very asymmetric about 0° incidence.

FIG. 9 is a partial cross-sectional view of a symmetric linear Fresnel lens 900.

FIGS. 10A through 10C depict the interference-free range in an array of adjacent symmetric linear Fresnel lenses. An array of three symmetric linear Fresnel lenses is shown with various rays traced for illustration. With on-axis illumination (FIG. 10A), the lenses are oriented in the same plane, with the apertures meeting edge-to-edge. The edge rays form isosceles triangles with the apertures. In FIG. 10A there is no interference. FIGS. 10B and 10C depict the interference-free ranges, respectively 1000 and 1002, which are equal angles. In this illustrative example, interference begins at ~37° in either direction.

FIG. 11 is a partial cross-sectional view of an asymmetric linear Fresnel lens 1100.

Figure 12B:
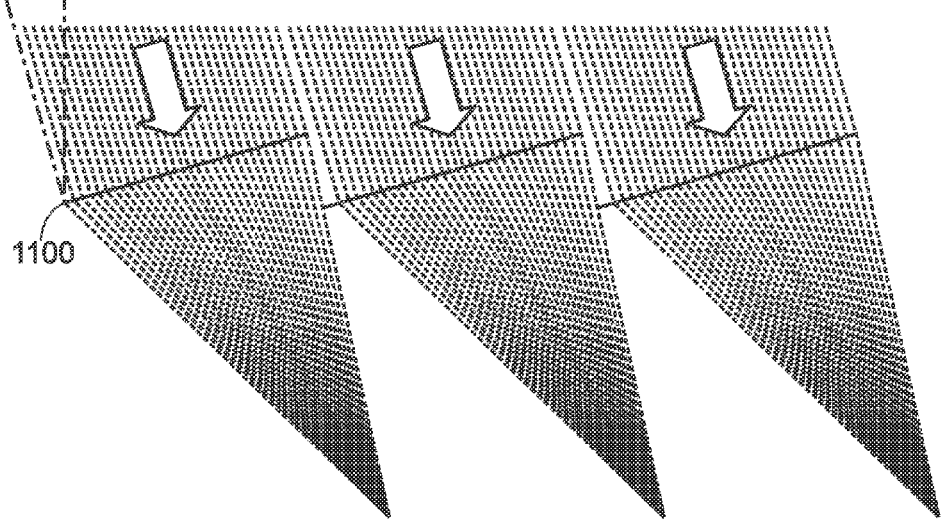
Figure 12C:
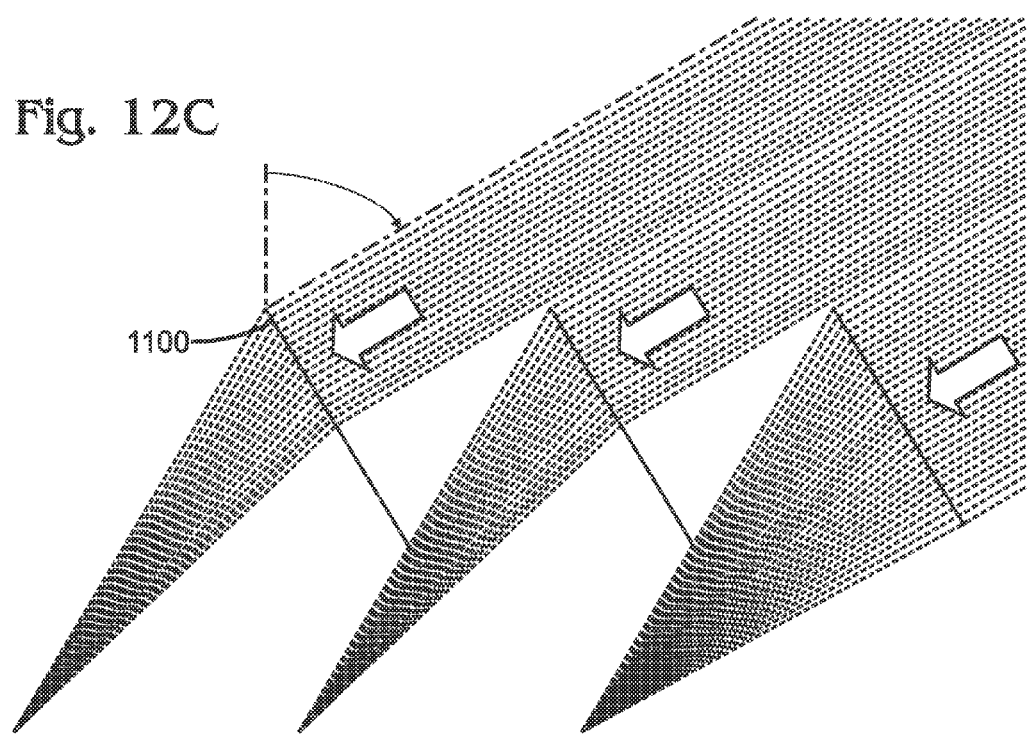
Figure 14A:
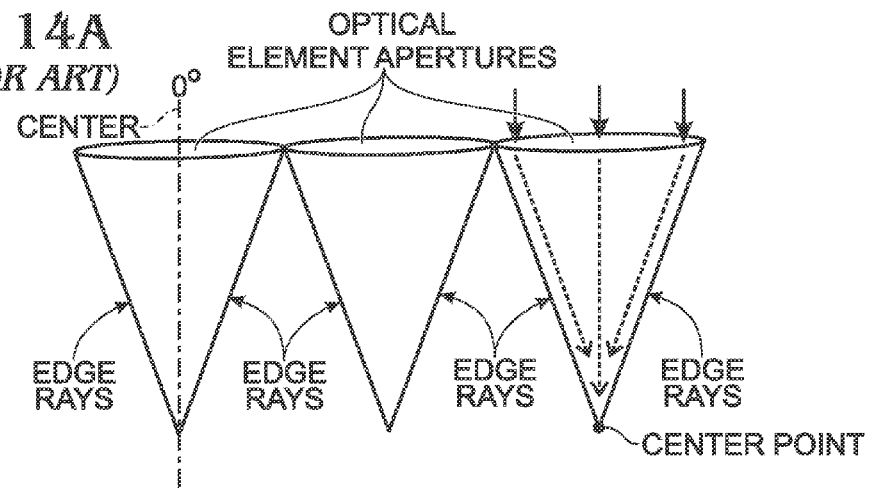
FIGS. 14a through 14C depict symmetric optics geometrically represented with isosceles triangles (prior art).
Figure 14B:
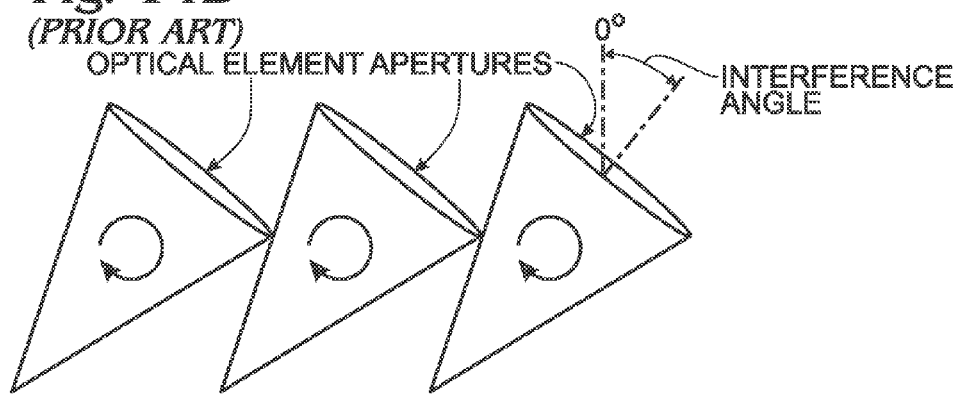
Figure 14C:
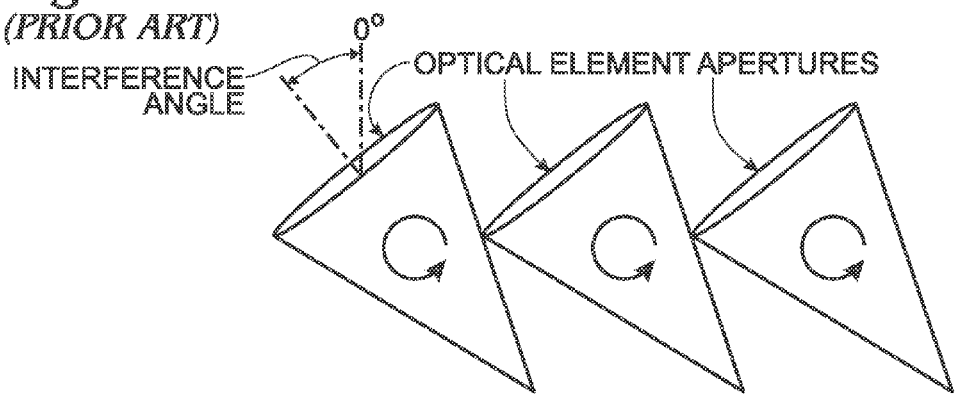

FIGS. 12A through 12C depict the interference-free range in an array of adjacent asymmetric linear Fresnel lenses. In FIG. 12A, with on-axis illumination, the lenses are oriented in the same plane, with the apertures meeting edge-to-edge. The edge rays form non-isosceles triangles with the apertures. FIGS. 12B and 12C show the lenses rotated in each direction until the apertures begin clipping the edge rays of the adjacent elements. In this illustrative example, interference begins at ~15" in one direction (FIG. 12B), and ~55° in the other direction (FIG. 12C).

The asymmetric range shown in FIGS. 12B and 12C can be tailored to meet specific design needs. The table below, from reference 13 (Cooper et al.), gives a useful summary of the range of incidence angles on a module that is externally tracked three different ways: single axis tracking about a Polar, Horizontal N-S, and Horizontal E-W axis. To achieve effective dual-axis tracking, the element rotations described in the figures above should have a range that can span $\partial_{min}$ to $\partial_{max}$. This is not difficult for Polar-axis tracking, since the optics must only operate over a +/−23.5° range. Horizontal E-W module tracking is not well suited for this purpose, since the range is +/−90°. Horizontal N-S module tracking is well-suited, depending on latitude. In Tucson, Ariz. ($\phi$=32.2° N), the range of solar incidence angles on a concentrator module tracked about a horizontal North-South oriented axis is highly asymmetric ($\partial_{min}$=−28.1 degrees to the North and $\partial_{max}$=+55.7 degrees to the South).

TABLE 1

Skew angle ranges for single-axis trackers.

| | Polar-Aligned | Horizontal North-South | Horizontal East-West |
|---|---|---|---|
| $\partial_{min}$ | −23.44° | $-\sin^{-1}[\sin(23.44°)\sec(\phi)]$ | −90° |
| $\partial_{max}$ | +23.44° | 23.44° + $|\phi|$ | +90° |

FIG. 13 is a flowchart illustrating a method for using asymmetrically focused CPV conversion in a hybrid trough solar power system. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps and is associated with the system and subcomponents of the system described in FIGS. 5 through 7D. The method starts at Step 1300.

Step 1302 concentrates light rays received in a plurality of transverse planes towards a primary linear focus in an axial plane, orthogonal to the transverse planes. Step 1304 transmits T band wavelengths of light to the primary linear focus. Step 1306 reflects R band wavelengths of light towards a secondary linear focus in the axial plane, parallel to the primary linear focus. Step 1308 translates the light received at the primary linear focus into thermal energy. Step 1310 asymmetrically focuses the light received at the secondary linear focus along a plurality of tertiary linear foci, orthogonal to the axial plane. For example, an asymmetric linear Fresnel lens may be used. Step 1312 concentrates the focused light in each tertiary primary focus into a plurality of receiving areas. Step 1314 translates the light accepted at the receiving areas into electrical energy.

In one aspect, concentrating light rays received in Step 1302 includes a reflective trough, having a primary axis and a parabolic curved surface, concentrating the light rays. In another aspect, transmitting light to the primary linear focus (Step 1306), and reflecting light towards the secondary linear focus (Step 1308) include using a dichroic spectrum splitter having a hyperbolically curved surface, an axis aligned in parallel to the primary linear focus, and a position between the secondary linear focus and the primary linear focus. The dichroic spectrum splitter transmits the T band wavelengths of light, and reflects the R band wavelengths light.

In one aspect, asymmetrically focusing the light received at the secondary linear focus in Step 1310 includes a plurality of corresponding asymmetric optical elements focusing the R band wavelengths of light. In another aspect, concentrating the focused light in each tertiary primary focus in Step 1312 includes a plurality of optical funnels aligned along each tertiary linear focus concentrating the focused light into a corresponding plurality of receiving areas.

In one aspect, asymmetrically focusing the light received at the secondary linear focus along the plurality of tertiary linear foci in Step 1310 includes a plurality of asymmetrical optical elements having optical input interfaces elongated along rotatable axes, orthogonal to the axial plane, asymmetrically focusing the light. In another aspect. Step 1310 rotates the optical input interfaces over an asymmetrical range of rotation. Asymmetrically rotating the optical input interfaces may insure that the optical input interfaces accept R band reflected light, free of interference from adjacent asymmetrical optical elements, over the asymmetrical range of rotation. In one aspect, the asymmetrical range of rotation is responsive to an Earth latitudinal position.

A system and method have been provided for a hybrid trough solar power system using asymmetrical photovoltaic light concentration in conjunction with a thermal collector. Examples of particular subcomponents and components layouts have been presented to illustrate the invention. However, the invention is not limited to merely these examples. Other variations and embodiments of the invention, will occur to those skilled in the art.

We claim:

1. A hybrid trough solar power system using concentrated photovoltaic (CPV) conversion in conjunction with a thermal collector, the system comprising:
   a reflective trough having a primary axis and a parabolic curved surface for concentrating light rays received in a plurality of transverse planes into a primary linear focus in an axial plane, orthogonal to the transverse planes;
   a dichroic spectrum splitter having a hyperbolically curved surface, an axis aligned in parallel to the primary linear focus, and a position between the reflective trough and the primary linear focus, the dichroic spectrum splitter transmitting T band wavelengths of light, and reflecting R band wavelengths of light to a secondary linear focus formed parallel to a vertex of the reflective trough in the axial plane;
   a thermal collection tube aligned along the primary linear focus for the T band wavelengths of light;
   a plurality of concentrating optics sections formed in series along the secondary linear focus, each concentrating optics section comprising:
      one optical imaging element focusing the R band wavelengths of light reflected by the dichroic spectrum splitter along a tertiary linear focus, orthogonal to the axial plane;
      a plurality of PV devices aligned along the tertiary linear focus of each associated optical imaging element, each PV device having an optical interface to receive the focused R band wavelengths of light; and
      a plurality of optical funnels aligned along the tertiary linear focus, for concentrating the focused R band wavelengths of light to the optical interfaces of corresponding PV devices; and,
   wherein each optical imaging element has an off-center tertiary linear focus that accepts converging edge rays having unequal angles defined between an aperture and the tertiary linear focus.

2. The system of claim 1 wherein each optical imaging element has an optical input interface elongated parallel to a corresponding rotatable axis, orthogonal to the secondary linear focus.

3. The system of claim 2 wherein the optical imaging elements are asymmetrically rotatable.

4. The system of claim 3 wherein each optical imaging element has a rotatable maximum first angle in a first direction during a summer solstice, and rotatable maximum second angle, greater than the first angle, in a second direction opposite the first direction, during a winter solstice.

5. The system of claim 4 wherein the first and second angles are responsive to an Earth latitudinal position of the system.

6. The system of claim 5 wherein the absolute magnitude of both the first angle and the second angle decreases in response to moving the position of the system closer to the Earth equator.

7. The system of claim 3 wherein each optical imaging element accepts light, free of interference from adjacent optical imaging elements, in a duration of time between a summer solstice and a winter solstice.

8. The system of claim 1 wherein each optical imaging element is an asymmetrical linear Fresnel lens.

* * * * *